(12) United States Patent
Allen et al.

(10) Patent No.: US 6,201,431 B1
(45) Date of Patent: Mar. 13, 2001

(54) METHOD AND APPARATUS FOR AUTOMATICALLY ADJUSTING NOISE IMMUNITY OF AN INTEGRATED CIRCUIT

(75) Inventors: David Howard Allen; Daniel Lawrence Stasiak, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,012

(22) Filed: Apr. 29, 1999

(51) Int. Cl.[7] .................................................... H03K 17/16
(52) U.S. Cl. .......................... 327/379; 327/292; 327/20; 327/551; 326/21
(58) Field of Search .............................. 327/115, 20, 292, 327/298, 387, 388, 541, 519, 551, 552, 553, 379, 25; 326/22, 31, 93, 94, 95, 96

(56) References Cited

U.S. PATENT DOCUMENTS

| | | | |
|---|---|---|---|
| 4,348,595 | * 9/1982 | Lebesnerais | 307/221 R |
| 4,587,620 | * 5/1986 | Niimi et al. | 364/574 |
| 5,065,048 | 11/1991 | Asai et al. | 326/34 |
| 5,091,658 | 2/1992 | Pribyl et al. | 326/21 |
| 5,442,671 | * 8/1995 | Wollschlager | 377/55 |
| 5,683,432 | * 11/1997 | Goedeke et al. | 607/32 |
| 5,838,169 | 11/1998 | Schorn | 326/98 |
| 5,838,170 | 11/1998 | Schorn | 326/34 |

* cited by examiner

Primary Examiner—Kenneth B. Wells
Assistant Examiner—Cassandra Cox
(74) Attorney, Agent, or Firm—Felsman, Bradley, Vaden, Gunter & Dillon

(57) ABSTRACT

An integrated circuit having an apparatus for automatically adjusting noise immunity is disclosed. The integrated circuit includes multiple functional logic circuits, a clock generator, a group of noise monitor circuits, and a control logic circuit. The clock generator generates a clock signal to all these circuits. The noise monitor circuits are utilized to detect noise occurring in the integrated circuit. In response to any noise detected by the noise monitor circuits, the control logic circuit decreases the speed of the clock signal sent to all the circuits, especially the functional logic circuits, via a slow down signal to the clock generator. Alternatively, the control logic circuit can inform the functional logic circuits via a noise alert signal to increase the noise immunity of certain noise sensitive circuits within the functional logic circuits.

11 Claims, 4 Drawing Sheets

METHOD AND APPARATUS FOR AUTOMATICALLY ADJUSTING NOISE IMMUNITY OF AN INTEGRATED CIRCUIT

BACKGROUND OF THE INVENTION

1. Technical Field

The present invention relates to integrated circuits in general, and in particular to a method and apparatus for providing noise immunity to an integrated circuit. Still more particularly, the present invention relates to a method and apparatus for automatically adjusting noise immunity of an integrated circuit.

2. Description of the Prior Art

Among integrated circuit design families, dynamic logic circuits offer significant advantages over their static logic circuit counterparts, particularly in performance and chip area requirements. Therefore, it is usually desirable to use dynamic logic circuits to implement as much of the logic function of an integrated circuit design as possible.

Generally speaking, dynamic logic circuits use a stored charge to represent a logic state. In operation, the charge is usually stored at a storage node during a precharge phase, and the charge is then conditionally discharged during an evaluation phase. However, the stored charge can be accidentally degraded due to various leakage or noise problems such as charge sharing, capacitive coupling from adjacent signals, sub-threshold conduction of n-channel pull-down transistors, and conduction through n-channel pull-down transistors due to noise on inputs. If a sufficient amount of the charge stored on the storage node is lost due to one or more of the above-mentioned problems, the output of the dynamic logic circuit will transition to an unintended state. This error can propagate and cause erroneous results throughout the entire integrated circuit design.

One method that can be used to avoid noise-induced failures is to provide some sort of "weak" feedback mechanism to maintain the stored charge at the storage node. However, the charge supplied by the weak feedback mechanism adversely affects the performance of the circuit. This is because, during the evaluation phase, the n-channel pull-down transistor network not only has to discharge the stored charge at the precharge node but also has to counter the small amount of charge supplied by the feedback mechanism. As a result, the amount of time to discharge the precharge node is increased. In view of such, a circuit designer must make a trade-off between the performance impact from sizing the feedback mechanism too large and the risk of not providing enough feedback by sizing the feedback mechanism too small. However, in most cases, such trade-offs are not even an option. For example, for reliability reasons, integrated circuits are often subjected to high-voltage and high-temperature burn-in tests in order to stress the design to accelerate early failures. Because high voltages and high temperatures can aggravate most of the above-mentioned leakage and noise problems, the circuit designer must design-in a greater amount of feedback than is required for normal operation in order to ensure that the integrated circuit will remain operational under the burn-in conditions. The additional amount of feedback can affect performance in stress conditions when high performance is not required as well as in normal operational conditions when performance is paramount.

SUMMARY OF THE INVENTION

In accordance with a preferred embodiment of the present invention, a noise-immune integrated circuit that is capable of automatically adapting to environmental changes includes multiple functional logic circuits, a clock generator, a group of noise monitor circuits, and a control logic circuit. The clock generator generates a clock signal to all these circuits. The noise monitor circuits are utilized to detect noise occurring in the integrated circuit. In response to any noise detected by the noise monitor circuits, the control logic circuit decreases the speed of the clock signal sent to all the circuits, especially the functional logic circuits, via a slow down signal to the clock generator. Alternatively, the control logic circuit can inform the functional logic circuits via a noise alert signal to increase the noise immunity of certain noise sensitive circuits within the functional logic circuits.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
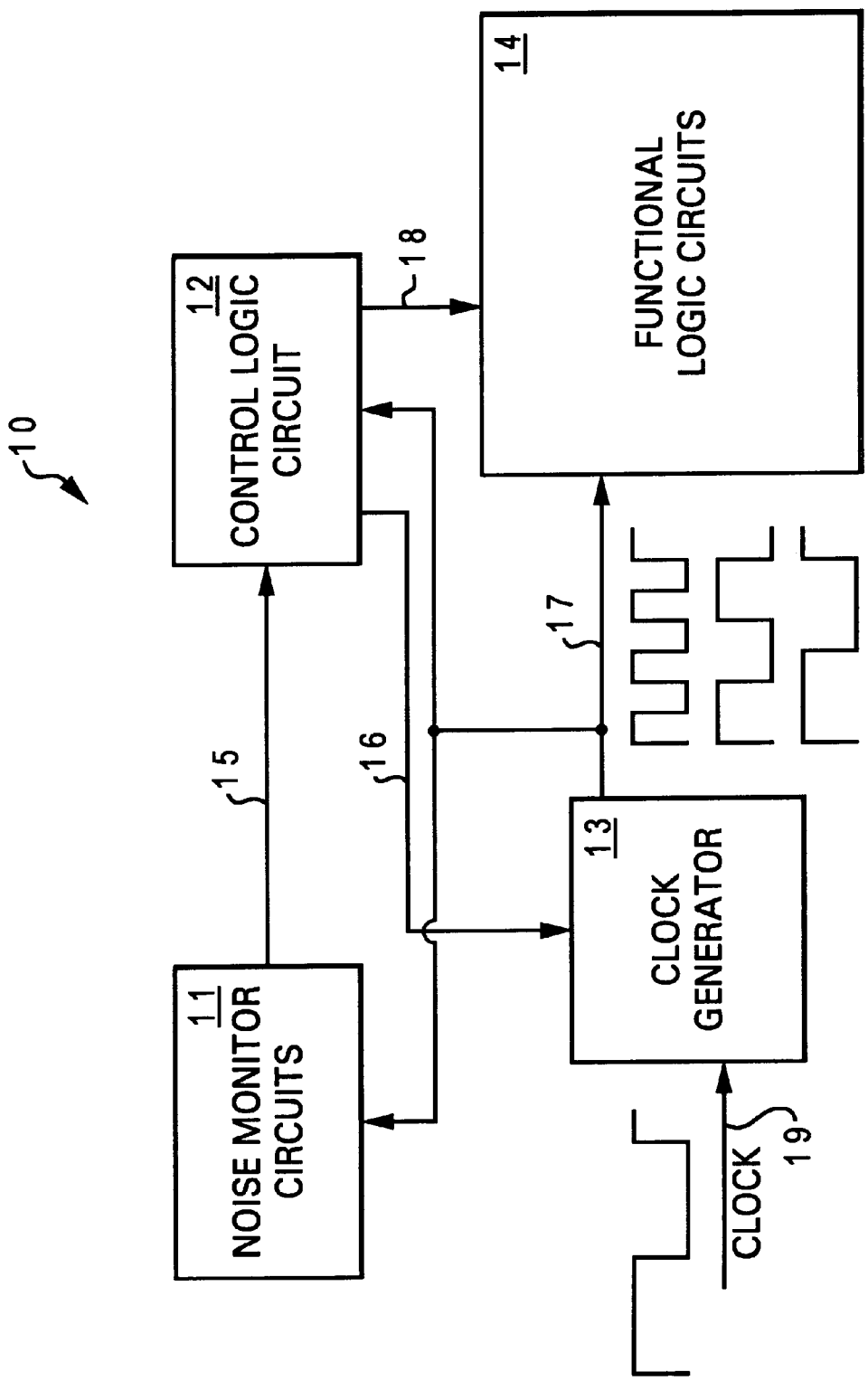
FIG. 1 is a diagram of an integrated circuit having an apparatus for automatically adjusting its noise immunity, in accordance with a preferred embodiment of the present invention.

Referring now to the drawings and in particular to FIG. 1, there is depicted a diagram of an integrated circuit having an apparatus for automatically adjusting its noise immunity, in accordance with a preferred embodiment of the present invention. As shown, an integrated circuit 10 includes noise monitor circuits 11, a control logic circuit 12, a clock generator circuit 13, and a group of functional logic circuits 14. Noise monitor circuits 11 include various noise-sensitive circuits. Each of these noise-sensitive circuits can be designed to be sensitive to at least one type of noise, including without limitation charge sharing, line-to-line capacitive coupling on inputs, charged particle interaction, power supply noise, thermal noise, and propagated noise. In addition, some of the noise-sensitive circuits within noise monitor circuits 11 are designed to be sensitive to varying degrees of a specific type of noise. For example, some noise-sensitive circuits are designed to fail due to a specific type of noise even under "nominal" operating conditions, and some noise-sensitive circuits are designed to fail under more noisy conditions. Still other noise-sensitive circuits are designed to be robust (not fail) until conditions become exceedingly bad.

Control logic circuit 12 accepts inputs from noise monitor circuits 11 via a control bus 15 and makes decisions as to what action must be taken based on the number, severity, and type of noise-induced failures indicated by noise monitor circuits 11. Clock generator circuit 13 accepts a clock source 19 from some external source, such as a system bus (not shown), and synthesizes a clock signal 17 to be utilized by noise monitor circuits 11, control logic circuit 12, and functional logic circuits 14. Clock signal 17 can be a multiple of the frequency of clock source 19. Functional logic circuits 14 are the actual functional logic implementation of integrated circuit 10.

As a preferred embodiment of the present invention, noise monitor circuits 11 detect if there is any noise within integrated circuit 10. If so, noise monitor circuits 11 then inform control logic circuit 12 through control bus 15. Accordingly, control logic circuit 12 decreases the speed of clock signal 17 via a slow down signal 16 to clock generator 13 and/or informs functional logic circuits 14 via a noise alert signal 18 that a noise event has occurred. After receiving noise alert signal 18, functional logic circuits 14 will increase the noise immunity of certain noise sensitive circuits.

A. Noise Monitor Circuits

Figure 2A:
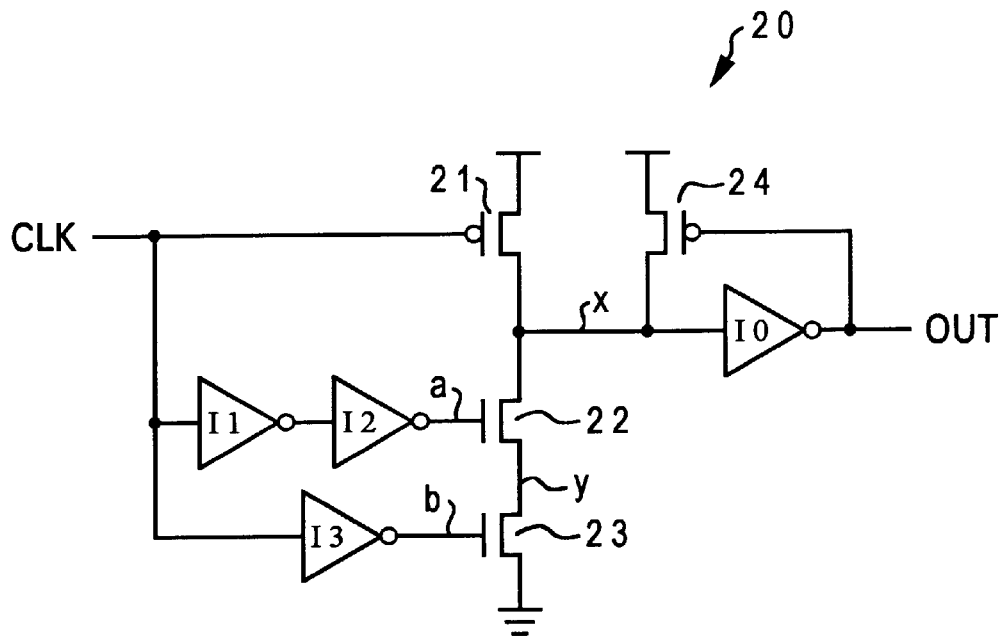
FIG. 2a is an exemplary noise monitor circuit in accordance with a preferred embodiment of the present invention.
Figure 2B:
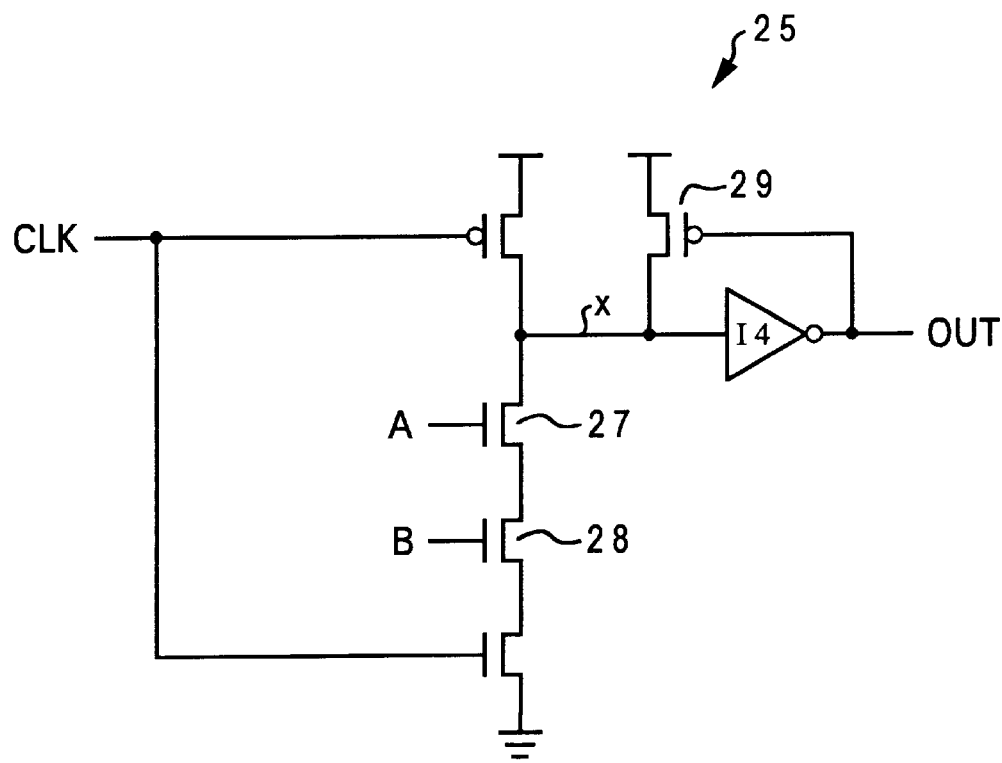
FIG. 2b is an exemplary domino logic AND gate.

As mentioned previously, noise monitor circuits 11 are designed to be more sensitive to environmental changes, such as temperature, voltage, and noise, than any other circuit used within the same integrated circuit. Each of noise monitor circuits 11 is intended to be sensitive to a particular source or sources of noise. With reference now to FIG. 2a, there is illustrated an exemplary noise monitor circuit, in accordance with a preferred embodiment of the present invention. Compared to a similar circuit such as domino logic circuit 25 depicted in FIG. 2b, noise monitor circuit 20 is designed to be more prone to charge sharing. This is because even though the topology of noise monitor circuit 20 is similar to that of domino logic circuit 25, the size of transistors for noise monitor circuit 20 are selected so that if environmental conditions degrade, noise monitor circuit 20 will always fail due to charge sharing before any other circuits.

Noise monitor circuit 20 operates as follows. During the precharge phase of a clock cycle (when CLK is low), precharge transistor 21 is on, transistor 22 is off because node a is low, and transistor 23 is on because node b is high. The intermediate node y between n-channel transistors 22 and 23 is discharged to ground. At the beginning of the evaluation phase (when CLK goes high), precharge transistor 21 is off. After a delay through inverter 13, node b goes low, and transistor 23 turns off. After a further delay through inverters 11 and 12, node a goes high. At this time, precharge node x and intermediate node y will share charge. The final voltage on node x will primarily depend on the ratio of capacitance between node x and the sum of capacitance on nodes x, y. If this final voltage is low enough, the output of inverter 10 will rise and will be sensed as a high voltage by any circuit sourced by noise monitor circuit 20. Typically, larger transistors, such as transistors 22 and 23, would have high source/drain diffusion capacitances, resulting in a high capacitance on node y. Smaller precharge and feedback transistors, such as transistors 21 and 24, respectively, would also result in less capacitance on node x. Likewise, smaller transistors within the inverter 10 would result in less capacitance on node x. The size of the feedback transistor 24, as previously described, will have a large effect on the final voltage of node x because transistor 24 continues to supply charge to node x unless and until output OUT has risen high enough to turn off transistor 24.

Another factor that can affect whether or not output OUT will transition is the ratio of the widths of the p-channel and n-channel transistors within invertor 10, i.e., $W_{p\text{-}channel}/W_{n\text{-}channel}$. This ratio is generally known as the "beta ratio" and it affects the transfer function (and trip point) of inverter 10. Typically, if the n-channel transistor is large with respect to the p-channel transistor (width of n-channel transistor ≫ width of p-channel transistor, assuming equal lengths), the beta ratio will be small, the trip point of inverter 10 will be relatively high, and a small voltage drop at node x as a result of charge sharing between node x and node y will result in output OUT rising to a high voltage level. Therefore, the following criteria should be used to design charge-sharing type of noise monitor circuits:

- transistors 22 and 23 should be very much larger than transistors 27 and 28 in order to provide a larger amount of diffusion capacitance on nodes between transistors 22 and 23 than nodes between transistors 27 and 28;
- the beta ratio of inverter 10 should be smaller than the beta ratio of inverter 14 and other inverters of the same function in other domino logic circuits; and
- feedback transistor 24 should be small (smaller width and longer length) compared to feedback transistor 29 and other feedback transistors performing the same function in other domino logic circuits.

Figure 3:
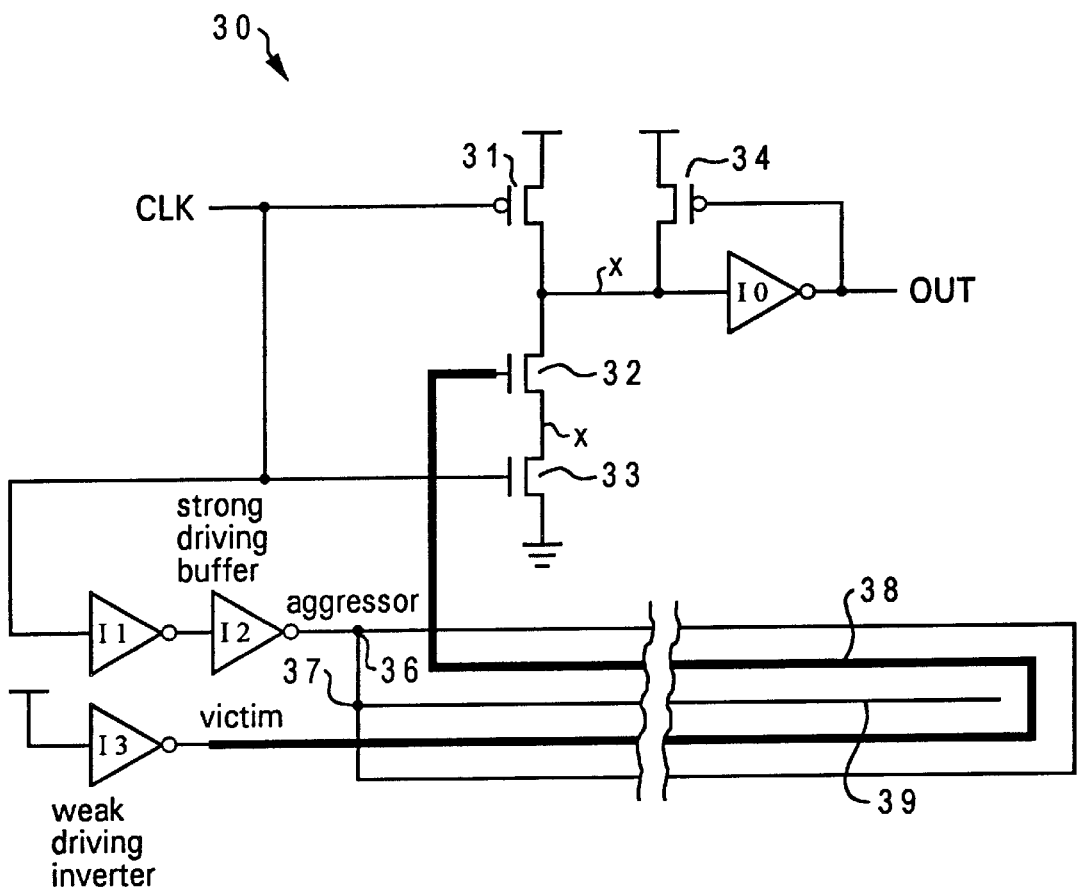
FIG. 3 is another exemplary noise monitor circuit in accordance with a preferred embodiment of the present invention.

Referring now to FIG. 3, there is illustrated another exemplary noise monitor circuit in accordance with a preferred embodiment of the present invention. Noise monitor circuit 30 is sensitive to noise on inputs that are attributed from capacitive coupling between wires. The topology of noise monitor circuit 30 and associated wiring is similar to other circuits found in the same integrated circuit, but the sizes of the transistors and wires in noise monitor circuit 30 have been selected to be more sensitive to process, temperature, and voltage variations that may aggravate failures due to wire coupling. During the precharge phase of a clock cycle (when CLK is low), precharge transistor 31 is on, transistor 33 is off, and an aggressor node 36 is low. A victim node 37 is driven low by a weak driving inverter 13, so transistor 32 is off. During the evaluation phase of the clock cycle (when CLK is high), precharge transistor 31 is off, transistor 33 is on, node y is discharging, and aggressor node 36 is strongly driven high. The fast rise time of aggressor node 36 creates a noise pulse on victim node 37 due to wire coupling. If the noise pulse is strong enough to turn transistor 32 on, precharge node x can be discharged causing the state of output OUT to switch.

The length of aggressor wire 38 and victim wire 39 can vary among different wire coupling noise monitors in order to produce a range of wire coupling scenarios. Longer wires have more coupling and create higher noise pulses. As in the charge-sharing type of monitor circuit shown in FIG. 2a, the beta ratio of inverter 10 is smaller than other inverters in similar circuits so that noise monitor 30 would be more sensitive to noise. The following criteria should be used to design wire-coupling type of noise monitor circuits:

- input feeding transistor 32 has noise due to various lengths of wire coupling;
- the beta ratio of inverter 10 should be smaller than the beta ratio of other inverters of the same function in domino circuits; and
- feedback transistor 34 should be small (smaller width and longer length) compared to the feedback transistor performing the same function in other circuits.

B. Control Logic Circuit

Control logic circuit 12 in FIG. 1 can be implemented with a variety of designs based on its setup and programming. In this embodiment, control bus 15 provides a means for communicating the occurrence of noise from noise monitor circuits 11. Such information can be "raw" output from noise monitor circuits 11 or encoded in some manner (for example, into a binary value indicating the number of failing circuits). Control bus 15 can further be divided into different groups of signals representing the different types of circuits that might be failing for various reasons such as charge sharing, line-to-line capacitive coupling, etc. By monitoring control bus 15, control logic circuit 12 determines when the noise level has exceeded an acceptable level of noise tolerance. This tolerance level can be stored in a register and modified by software. Once the tolerance level has been exceeded, control logic circuit 12 reduces the performance of functional logic circuits 14 while maintaining functionality. For example, control logic circuit 12 can slow down the clock signals to functional logic circuits 14 and/or increase the noise immunity of some circuits within functional logic circuits 14. The noise immunity of a circuit within functional logic circuits 14 can be adjusted by selectively controlling the amount of feedback that is supplied to a precharge node of a dynamic logic circuit.

Figure 4:
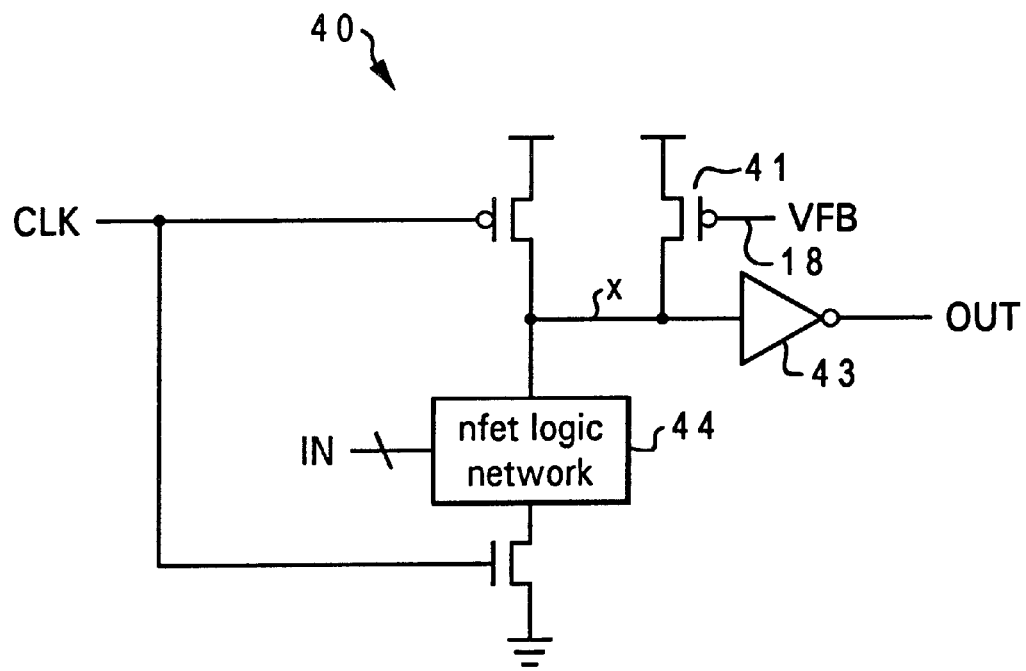
FIG. 4 is a circuit diagram of a domino logic circuit having a control circuit for selectively controlling the amount of feedback that is supplied to a precharge node, in accordance with a preferred embodiment of the present invention.

With reference now to FIG. 4, there is illustrated a general topology of a domino logic circuit having a control circuit for selectively controlling the amount of feedback that is supplied to a precharge node, in accordance with a preferred embodiment of the present invention. As shown, a p-channel feedback transistor 41 with its source connected to a power supply $V_{dd}$, its drain connected to a precharge node x, and its gate connected to a variable-feedback voltage (VFB) provided by a variable-feedback voltage supply via, for example, noise alert signal 18 (from FIG. 1). The VFB controls how much current is supplied to precharge node x by feedback transistor 41. If VFB is at ground, then the gate-to-source voltage ($V_{gs}$) of feedback transistor 41 is on. This provides the maximum amount of feedback current to circuit 40. This is useful when circuit 40 is operating under conditions of maximum leakage and noise, and where performance is not a concern (for example, during burn-in conditions). If VFB is at $V_{dd}$, feedback transistor 41 is off, and no current is supplied to precharge node x. This may not be very desirable in most cases but under some circumstances (for example, at high frequency), this configuration may allow circuit 40 to operate and provide the highest performance. The normal operating configuration for circuit 40 is when VFB is slightly less than $V_{dd}$. This configuration allows feedback transistor 41 to conduct some current in a sub-threshold condition. This configuration also provides the minimal amount of current that is required for safe operation (compensating for leakage, etc.), but does not significantly impair performance because the amount of current that must be overcome by the n-channel pull-down transistor network is negligible. Thus, the voltage level of VFB would preferably be ground under stressful, non-performance-critical conditions (reliability stress) and biased slightly below $V_{dd}$ for normal operations.

In an integrated circuit design, a single VFB could be centrally generated using well-known voltage biasing techniques, and distributed globally for use by all domino circuits within an integrated circuit. Alternately, a local VFB can also be generated, which allows local control of the VFB, in order to tailor the voltage level of the VFB to meet the specific needs of an individual circuit within the integrated circuit.

One drawback of the VFB control circuit as shown in FIG. 4 is that when precharge node x is pulled low during the evaluation phase, feedback transistor 41 is still supplying current to precharge node x, which results in a DC path (albeit weak) from $V_{dd}$ to ground. Although the magnitude of the current is small and the n-channel transistors within pull-down transistor network 44 is typically sized such that the voltage level of precharge node x drops very close to ground, a small amount of current accumulated over hundreds of thousands of such circuits can reach a significant level. This is particularly troublesome in low-power applications or in designs that utilize a quiescent current (standby current) screen to detect defects. A variation of the VFB control circuit includes a second p-channel transistor in series with feedback transistor 41. The second p-channel transistor is gated by output OUT of an inverter 43, as is normally done for domino gates.

Figure 5:
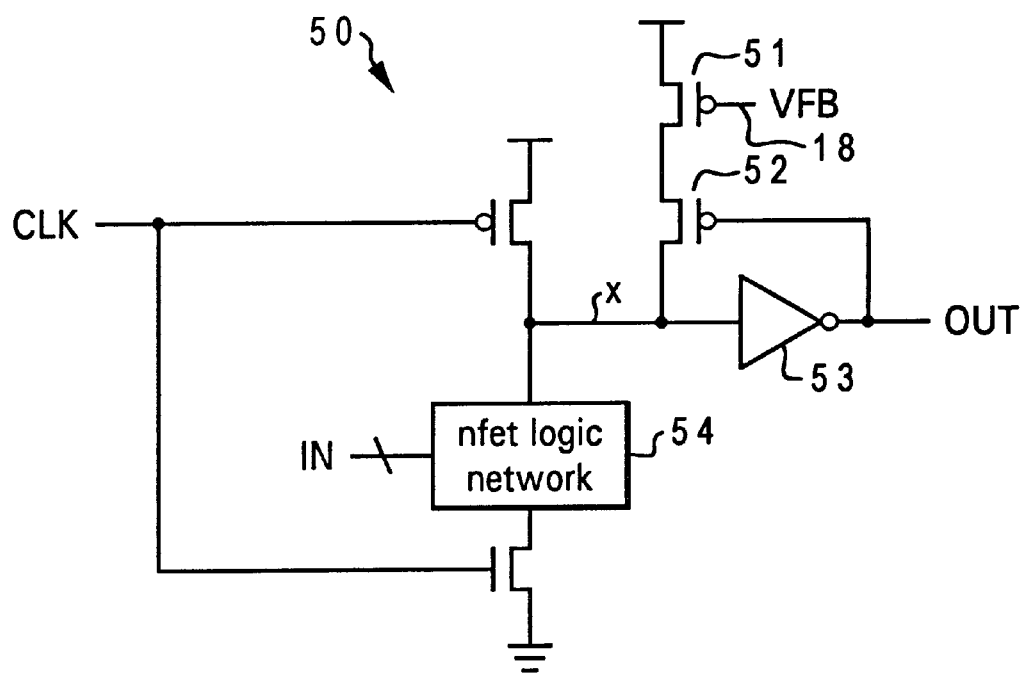
FIG. 5 is a circuit diagram of an alternative embodiment of the circuit from FIG. 4, in accordance with a preferred embodiment of the present invention.

Referring now to FIG. 5, there is illustrated a circuit diagram of an alternative embodiment of the VFB control circuit as shown in FIG. 4, in accordance with a preferred embodiment of the present invention. As shown, a p-channel transistor 52 is connected between a feedback transistor 51 and precharge node x. The gate of transistor 52 is connected to output OUT of an inverter 53. In normal operation, when node x is precharged high and the inputs of n-channel pull-down transistor network 54 are such that the evaluation will not cause precharge node x to discharge, output OUT remains low and feedback transistor 51 is fully on. However, when the VFB is slightly below $V_{dd}$ and feedback transistor 52 can conduct only a small amount of current, the series combination of transistors 51 and 52 provides only a small amount of feedback current allowed by transistor 51. When more feedback is required, the VFB is lowered (as low as ground) and transistor 52 can conduct additional current. Regardless of the voltage level of the VFB, if the inputs of n-channel pull-down transistor network 54 during the evaluation phase are such that precharge node x is discharged, output OUT will eventually go high and cause transistor 51 to stop conducting entirely. At that point, no DC path between $V_{dd}$ and ground exists because the current is practically zero.

As has been described, the present invention provides a method and apparatus for automatically adjusting noise immunity of an integrated circuit. With the present invention, the amount of feedback supplied to a precharge node of a circuit and/or the clock speed of the circuit can be selectively controlled.

While the invention has been particularly shown and described with reference to a preferred embodiment, it will be understood by those skilled in the art that various changes in form and detail may be made therein without departing from the spirit and scope of the invention.

What is claimed is:

1. An integrated circuit having an apparatus for automatically adjusting noise immunity, comprising:
   a plurality of functional logic circuits;
   a clock generator, coupled to said plurality of functional logic circuits, for generating a clock signal to said plurality of functional logic circuits;
   a noise monitor circuit for detecting noise within said integrated circuit; and
   a control logic circuit, coupled to said clock generator and said noise monitor circuit, for decreasing a frequency of said clock signal sent to said plurality of functional logic circuits, in response to noise, detected by said noise monitor circuit, being above a predetermined threshold.

2. The integrated circuit according to claim 1, wherein said control logic circuit generates a slow down signal to said clock generator in response to noise, detected by said noise monitor circuit, being above said predetermined threshold.

3. The integrated circuit according to claim 1, wherein said noise monitor circuit is sensitive to at least one type of noise.

4. The integrated circuit according to claim 1, wherein said noise monitor circuit is more noise sensitive than a similar circuit in said plurality of functional logic circuits.

5. An integrated circuit having an apparatus for automatically adjusting noise immunity, comprising:

a plurality of functional logic circuits;

a noise monitor circuit for detecting noise within said integrated circuit; and a control logic circuit, coupled to said plurality of functional logic circuits and said noise monitor circuit, for increasing a noise immunity of selective noise sensitive circuits within said plurality of functional logic circuits, in response to noise, detected by said noise monitor circuit, being above a predetermined threshold.

6. The integrated circuit according to claim 5, wherein said control logic circuit generate a noise alert signal to said plurality of functional logic circuits, in response to noise, detected by said noise monitor circuit, being above said predetermined threshold.

7. The integrated circuit according to claim 5, wherein said noise monitor circuit is sensitive to at least one type of noise.

8. The integrated circuit according to claim 5, wherein said noise monitor circuit is more noise sensitive than a similar circuit in said plurality of functional logic circuits.

9. The integrated circuit according to claim 5, wherein some of said plurality of functional logic circuits are domino circuit having a feedback control.

10. A method for automatically adjusting noise immunity of an integrated circuit, said method comprising the steps of:

generating a clock signal to a plurality of functional logic circuits within said integrated circuit;

detecting noise within said integrated circuit; and in response to detected noise above a predetermined threshold, decreasing a frequency of said clock signal sent to said plurality of functional logic circuits by generating a slow down signal to a clock generator.

11. The method according to claim 10, wherein said detecting step is performed by a noise monitor circuit that is sensitive to at least one type of noise.

* * * * *